US011881285B2

(12) United States Patent
Takkala

(10) Patent No.: US 11,881,285 B2
(45) Date of Patent: Jan. 23, 2024

(54) ACCESSING MEMORY CIRCUIT

(71) Applicant: Nordic Semiconductor ASA, Trondheim (NO)

(72) Inventor: Jussi Takkala, Oulu (FI)

(73) Assignee: Nordic Semiconductor ASA, Trondheim (NO)

( * ) Notice: Subject to any disclaimer, the term of this patent is extended or adjusted under 35 U.S.C. 154(b) by 166 days.

(21) Appl. No.: 17/699,813

(22) Filed: Mar. 21, 2022

(65) Prior Publication Data

US 2022/0310140 A1 Sep. 29, 2022

(30) Foreign Application Priority Data

Mar. 23, 2021 (FI) ...................................... 20215325

(51) Int. Cl.
*G11C 7/10* (2006.01)
*G11C 7/20* (2006.01)
(52) U.S. Cl.
CPC .......... *G11C 7/1066* (2013.01); *G11C 7/1063* (2013.01); *G11C 7/1093* (2013.01); *G11C 7/20* (2013.01)
(58) Field of Classification Search
CPC ... G11C 7/1066; G11C 7/1063; G11C 7/1093; G11C 7/20
See application file for complete search history.

(56) References Cited

U.S. PATENT DOCUMENTS

| 5,155,812 | A | | 10/1992 | Ehlig et al. |
| 5,740,404 | A | * | 4/1998 | Baji ..................... G06F 13/4213 |
| | | | | 711/170 |
| 6,449,193 | B1 | * | 9/2002 | Love ........................ G11C 8/04 |
| | | | | 365/230.09 |
| 10,276,221 | B2 | * | 4/2019 | Sugahara ............... G11C 7/222 |
| 2002/0184420 | A1 | | 12/2002 | Maone et al. |

OTHER PUBLICATIONS

Finnish Search Report dated Nov. 18, 2021, in connection with corresponding FI Application No. 20215325 (1 pp.).

* cited by examiner

*Primary Examiner* — Son L Mai
(74) *Attorney, Agent, or Firm* — Nixon & Vanderhye PC

(57) ABSTRACT

According to an aspect, there are provided an apparatus and a method for providing an access to a memory circuit. A read enable input initializing a wait state counter configured to count a predetermined number of clock cycles is received (200) and the wait state counter output is monitored. A memory ready signal output is received (202) from the memory circuit at a synchronizer input and the output signal of the synchronizer is monitored. An ON-state data ready signal is provided (204) when either the wait state counter has elapsed, or the output signal of the synchronizer is in ON-state.

10 Claims, 3 Drawing Sheets

ACCESSING MEMORY CIRCUIT

TECHNICAL FIELD

Various example embodiments relate to accessing memory circuits.

This application claims priority to FI 20215325 filed Mar. 23, 2021, the entire contents of which are hereby incorporated by reference.

BACKGROUND

In computing design one of the main goals is to realize fast operation of devices. When operating with memory circuits, one key measure is memory access time. Memory access time defined as the time is between start of read to the time when data is valid and settled in memory outputs.

There are various items which effect on the memory access time of memory circuits. For example, varying environmental parameters or operating conditions may have an effect on the memory access time. Varying process, voltage and temperature, PVT, conditions may cause variations in access times.

BRIEF DESCRIPTION

According to an aspect, there is provided a method for providing an access to a memory circuit, the method comprising: receiving a read enable input initializing a wait state counter configured to count a predetermined number of clock cycles and monitoring the wait state counter output; receiving a memory ready signal output from the memory circuit at a synchronizer input and monitoring the output signal of the synchronizer; providing an ON-state data ready signal when either the wait state counter has elapsed, or the output signal of the synchronizer is in ON-state.

According to another aspect, there is provided an apparatus for providing an access to a memory circuit, comprising: a wait state counter configured to receive a read enable input initializing the wait state counter and count a predetermined number of clock cycles; synchronizer having as an input a memory ready signal output operationally connected to the memory circuit, and providing a synchronized memory ready signal at the output of the synchronizer; and a circuitry having as an input the output of the wait state counter and the output of the synchronizer and configured to provide an ON-state data ready signal when either the wait state counter has elapsed, or the output signal of the synchronizer is in ON-state.

One of the advantaged provided by the aspects is that memory access times can be minimized regardless of the process, voltage and temperature conditions.

Embodiments are defined in the dependent claims. The scope of protection sought for various embodiments is set out by the independent claims.

The embodiments and features, if any, described in this specification that do not fall under the scope of the independent claims are to be interpreted as examples useful for understanding various embodiments of the invention.

BRIEF DESCRIPTION OF DRAWINGS

In the following, example embodiments will be described in greater detail with reference to the attached drawings, in which.

DETAILED DESCRIPTION OF SOME EMBODIMENTS

In many applications, fast memory access in of upmost importance. Any decrease in access times will usually improve the performance of apparatuses relying on memory access. Longer operating times also increase power consumption. This applies to numerous electronic devices such as computers, mobile phones, tablets or any data processing device in general.

Varying process, voltage and temperature, PVT, conditions are common issues in memory access. The term process relates here to the manufacturing phase of memory circuits which are typically integrated circuits. Memory circuits are manufactured on silicon wafers with varying diameter. The wafers comprise memory circuits as dies which are cut apart from the wafer. When manufacturing memory circuits the purpose is to use a given linewidth, which may be some tens or hundreds of nanometers, for example. It has been noticed that the linewidth of dies at the center of the wafer is more accurate than the linewidth of dies situated farther form the center of the wafer. This deviation may cause that different memory circuits act differently regarding access times even when they originate from the same wafer.

Voltage refers to the operating voltage fed to the memory circuit. If the voltage changes from the nominal voltage the circuit is designed to be used, this may cause variations in access times of the memory circuits.

Ambient temperature may also influence the operation of the memory circuits.

There are different types of memory circuits. Some examples of the types are Ferroelectric Random-Access Memory, F-RAM, Phase-change RAM or PRAM and Magnetoresistive RAM, MRAM, to name a few. Some memory types are more susceptible to varying PVT conditions than others. For example, MRAM belongs to the type that has relative high PVT variation. In different PVT conditions the memory access time may vary considerably.

Figure 1:
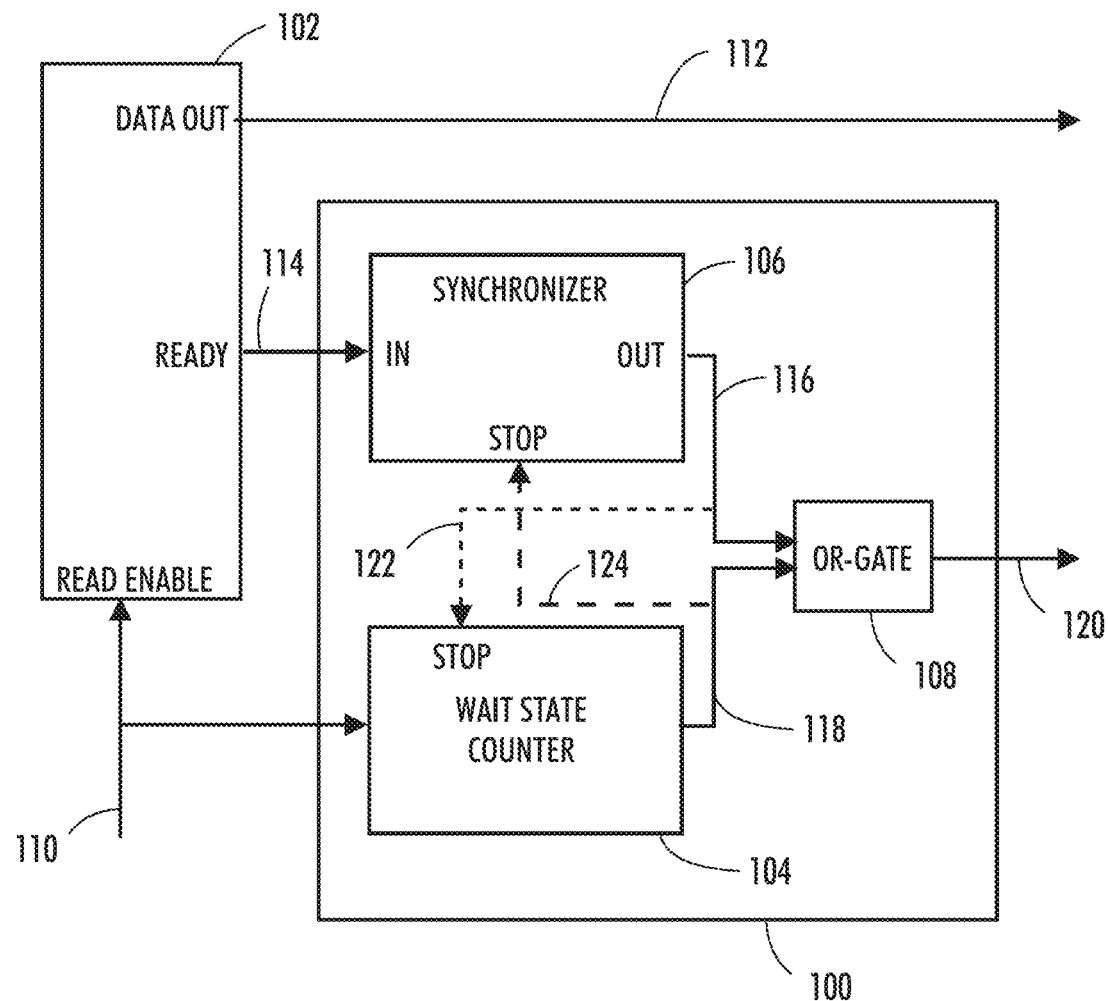
FIG. 1 illustrates an example of an arrangement.

FIG. 1 illustrates an embodiment of an apparatus 100 configured to provide an access to a memory circuit 102. The apparatus is capable of providing an access to a memory circuit in such a manner that memory access times can be minimized regardless of the PVT conditions.

In the embodiment of FIG. 1, the apparatus 100 comprises a wait state counter 104, a synchronizer 106 and a circuitry 108.

The wait state counter 104 is configured to receive a read enable input 110 initializing the wait state counter and count a predetermined number of clock cycles. The read enable input 110 is also provided to the read enable input of the memory circuit 102.

In an embodiment, the predetermined number of clock cycles is calculated based on a worst-case estimate for memory access delay of the memory circuit. That is, when the wait state counter elapses, the memory circuit is guaranteed to have the required data at its output 112. Typically, the access times of memory circuits at different conditions are specified in memory data sheets.

The synchronizer 106 has an input operationally connected to a memory ready signal output 114 of the memory circuit 100. The synchronizer 106 is configured to provide a synchronized memory ready signal 116 at the output of the synchronizer 106. When the memory circuit has not yet produced data at its output 112, the memory ready is in OFF-state. When the memory circuit has produced data at its output 112, the memory ready is in ON-state. Because memory ready signal 114 of the memory circuit is asynchronous, it is taken to the synchronizer 106 which synchronizes the memory ready signal to local clock.

The circuitry 108 has as an input the output 118 of the wait state counter 104 and the output 114 of the synchronizer.

The circuitry is configured to provide an ON-state data ready signal 120 at the output of the circuitry when either the wait state counter has elapsed, or the output signal 114 of the synchronizer is in ON-state. Otherwise, the output of the circuitry provides an OFF-state data ready signal 118. In an embodiment, the circuitry 108 is an OR-gate.

Thus, the circuitry is configured to provide an ON-state data ready signal 120 when either the wait state counter or the synchronizer has indicated that data is ready at the memory circuit output 112.

In an embodiment, a stop signal 122 from the synchronizer is provided to the wait state counter to stop the wait state counter if the synchronized ready signal output enters to ON-state before the wait state counter has elapsed. In an embodiment, a stop signal 124 is provided from the wait state counter to the synchronizer to stop the synchronizer if the wait state counter has elapsed before the synchronized ready signal output enters to ON-state. In an embodiment, these stop signals prevent possibility of the arrival of two separate data ready signals.

Figure 2:
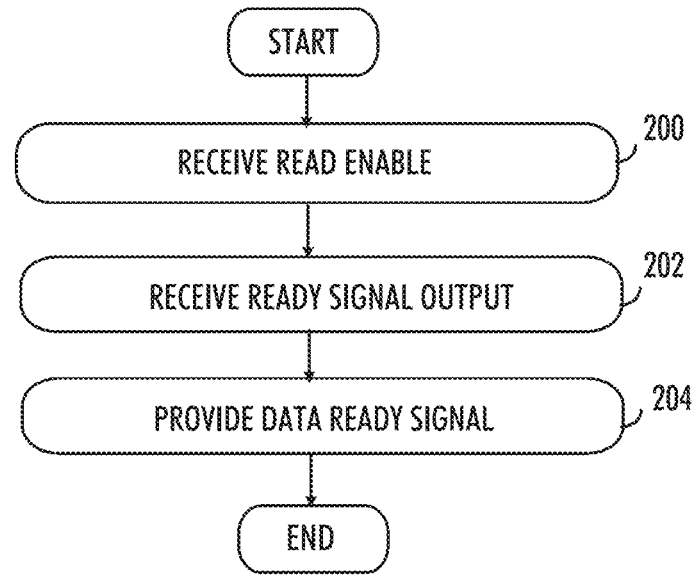
FIGS. 2 and 3 are flowcharts illustrating embodiments.

FIG. 2 is a flowchart illustrating an embodiment. The flowchart illustrates the operation of the apparatus 100 providing an access to the memory circuit 102.

In step 200, the apparatus is configured to receive a read enable input 110 initializing a wait state counter 104 configured to count a predetermined number of clock cycles. The apparatus is further configured to monitor the wait state counter output 118.

In step 202, the apparatus is configured to receive a memory ready signal output 114 from the memory circuit at a synchronizer 106 input and monitor the output signal 116 of the synchronizer.

In step 204, the apparatus is configured to provide an ON-state data ready signal 120 when either the wait state counter 104 has elapsed, or the output signal 116 of the synchronizer is in ON-state.

Figure 3:
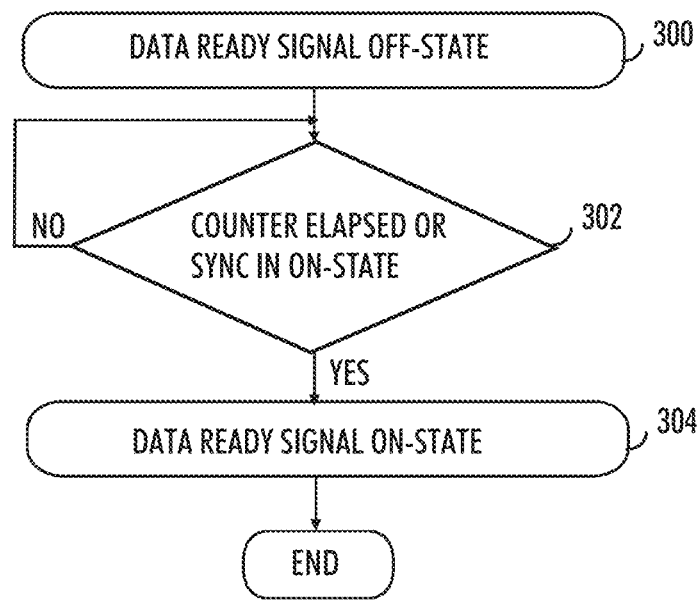

FIG. 3 is a flowchart illustrating an embodiment. The flowchart illustrates the operation of the apparatus 100 providing an access to the memory circuit 102 a bit further.

In step 300, the data ready signal 120 at the output of the apparatus 100 is in OFF-state. This denotes that data is not yet available at the data output of the memory circuit 102.

In step 302, the apparatus is configured to monitor whether the wait state counter 104 has elapsed based on the output signal 118 of the wait state counter and monitor whether the output signal 116 of the synchronizer is in ON-state.

If either monitoring provides a positive result, then the apparatus is configured in step 304 to set the data ready signal 120 at the output of the apparatus 100 to an ON-state. This denotes that data is available at the data output 112 of the memory circuit 102.

Thus, the apparatus of FIG. 1 is configured to monitor two separate signals in when a memory circuit is accessed. The signal provided by the wait state counter provides a data ready indicator for a worst-case scenario, where the memory circuit specifications guarantee that requested data is at the data output of the memory circuit. This may correspond to slow PVT conditions. On the other hand, the output signal 116 of the synchronizer provides a data ready indicator in fast PVT conditions.

A device utilizing data from the memory circuit 102 may receive the data ready signal 120 from the output of the apparatus. When the device detects that the data ready signal 120 in in ON-state, it may determine that data is ready for reading at the data output 112 of the memory circuit 102.

The proposed solution is especially advantageous when memory circuits with large PVT variations are used, but it is usable with all types of memory circuits.

Figure 4:
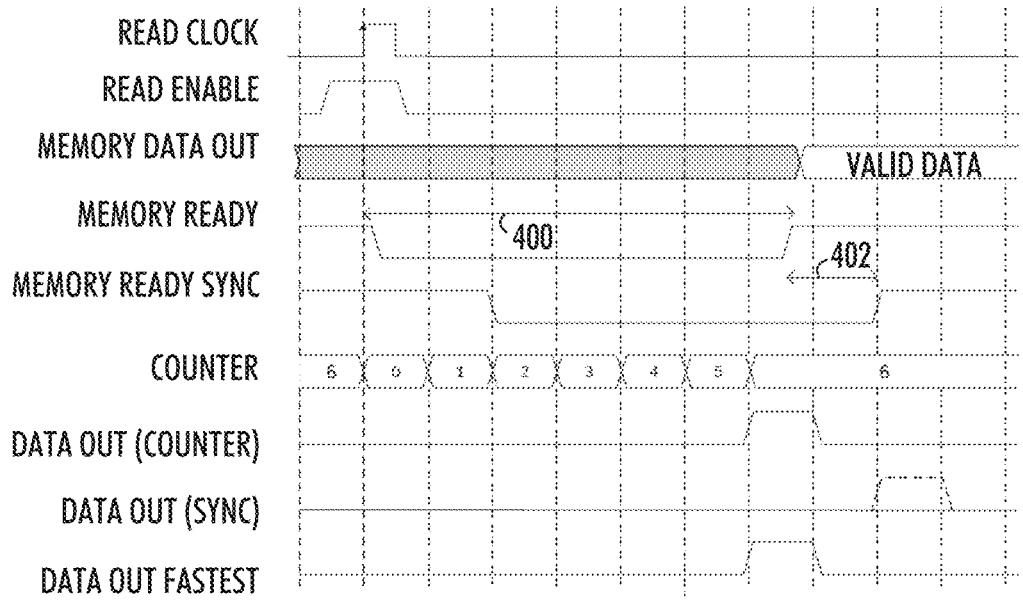
FIGS. 4 and 5 are charts illustrating memory read operations.
Figure 5:
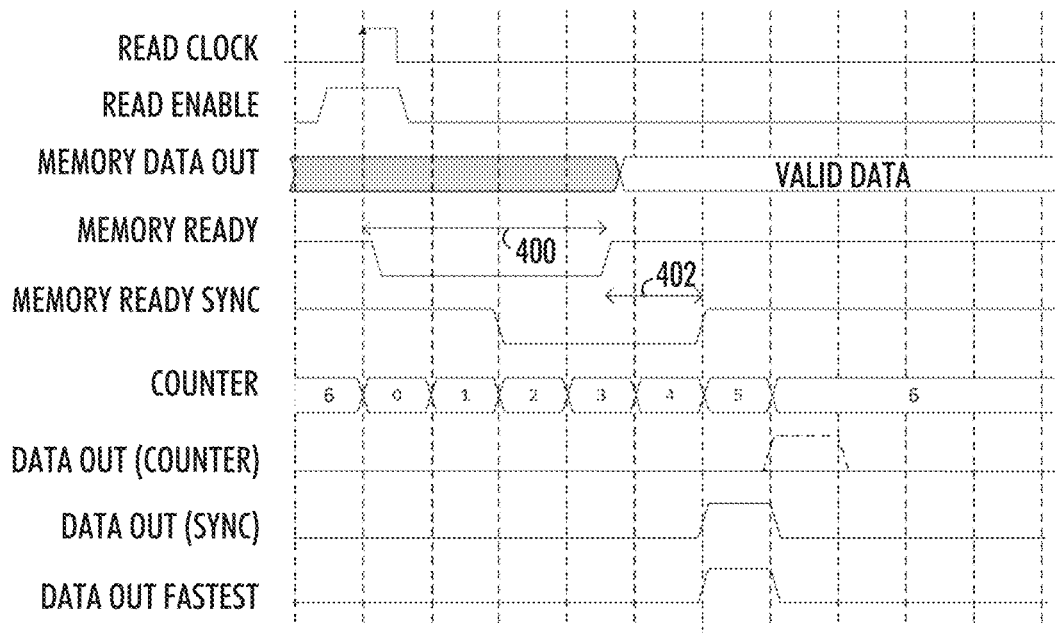

FIGS. 4 and 5 are charts illustrating memory read operations. FIG. 4 illustrates an example of a situation with slow PVT conditions. Here counting the wait states is the fastest way of indicating that data is ready at the memory output. The read enable signal initializes the wait state counter. In this example, the predetermined number of clock cycles is assumed to be six. Memory ready is the ready signal 114 from the memory circuit. The memory access time is OFF state 400 until the memory circuit can provide data at its output. However, due to synchronization delay 402, the wait state counter can indicate the data ready condition faster than the synchronization output 116. The last three lines indicate the read time based on the wait state counter, the sync output and the fastest indication which in this case is the wait state counter. It may be noted that in this example the stop signal (denoted with 124 in FIG. 1) from the wait state counter will stop the synchronizer when the wait state counter output indicates data is ready. This is indicated in FIG. 4 with a dashed line on the sync output.

FIG. 5 illustrates an example of a situation with fast PVT conditions. Here the sync output is the fastest way of indicating that data is ready at the memory output. The read enable signal initializes the wait state counter. In this example, the predetermined number of clock cycles is assumed to be six. Memory ready is the ready signal 114 from the memory circuit. The memory access time is OFF state 400 until the memory circuit can provide data at its output. Because of the fast conditions, the memory ready signal provides a faster indication than the wait state counter regardless of the synchronization delay 402. The last three lines indicate the read time based on the wait state counter, the sync output, and the fastest indication which in this case is the memory ready signal. It may be noted that in this example the stop signal (denoted with 122 in FIG. 1) from the synchronizer will stop the wait state counter when the synchronizer output indicates data is ready. This is indicated in FIG. 5 with a dashed line on the wait state counter output.

The proposed apparatus can be realized as a circuitry operationally connected to a memory circuit and providing the read enable input, memory ready input and data ready output, for example. Also, other input and output may be provided.

As used in this application, the term 'circuitry' refers to one or more of the following: hardware-only circuit implementations such as implementations in only analogue and/or digital circuitry; combinations of hardware circuits and software and/or firmware; and circuits such as a microprocessor(s) or a portion of a microprocessor(s) that require software or firmware for operation, even if the software or firmware is not physically present. This definition of 'circuitry' applies to uses of this term in this application. As a further example, as used in this application, the term "circuitry" would also cover an implementation of merely a processor (or multiple processors) or portion of a processor, e.g. one core of a multi-core processor, and accompanying software and/or firmware. The term "circuitry" would also cover, for example and if applicable to the particular element, a baseband integrated circuit, an application-specific integrated circuit (ASIC), and/or a field-programmable grid array (FPGA) circuit for the apparatus according to an embodiment of the invention.

Embodiments described herein are applicable to various systems where memory circuits are accessed. defined above but also to other systems. The protocols used, the specifications of the systems and their elements develop rapidly. Such development may require extra changes to the described embodiments. Therefore, all words and expressions should be interpreted broadly, and they are intended to illustrate, not to restrict, the embodiment. It will be obvious to a person skilled in the art that, as technology advances, the inventive concept can be implemented in various ways. Embodiments are not limited to the examples described above but may vary within the scope of the claims.

The invention claimed is:

1. A method for providing an access to a memory circuit, the method comprising:
   receiving a read enable input initializing a wait state counter configured to count a predetermined number of clock cycles and monitoring the wait state counter output;
   receiving a memory ready signal output from the memory circuit at a synchronizer input and monitoring the output signal of the synchronizer;
   providing an ON-state data ready signal when either the wait state counter has elapsed, or the output signal of the synchronizer is in ON-state.

2. The method of claim 1, further comprising:
   providing a stop signal from the synchronizer to the wait state counter if the synchronized ready signal output enters to ON-state before the wait state counter has elapsed.

3. The method of claim 1, further comprising:
   providing a stop signal from the wait state counter to the synchronizer if the wait state counter has elapsed before the synchronized ready signal output enters to ON-state.

4. The method of claim 1, further comprising:
   feeding the wait state counter output and the output of the synchronizer to an OR-gate and providing the data ready signal monitoring the at output of the OR-gate.

5. The method of claim 1, wherein the ON-state data ready signal indicates that data is ready at data output of the memory circuit.

6. The method of claim 1, wherein the predetermined number of clock cycles is calculated based on a worst-case estimate for memory access delay of the memory circuit.

7. An apparatus for providing an access to a memory circuit, comprising:
   a wait state counter configured to receive a read enable input initializing the wait state counter and count a predetermined number of clock cycles;
   synchronizer having as an input a memory ready signal output operationally connected to the memory circuit, and providing a synchronized memory ready signal at the output of the synchronizer; and
   a circuitry having as an input the output of the wait state counter and the output of the synchronizer and configured to provide an ON-state data ready signal when either the wait state counter has elapsed, or the output signal of the synchronizer is in ON-state.

8. The apparatus of claim 7, wherein
   the synchronizer is configured to provide a stop signal to the wait state counter if the synchronized ready signal output enters to ON-state before the wait state counter has elapsed.

9. The apparatus of claim 7, wherein
   the wait state counter configured to provide a stop signal to the synchronizer if the wait state counter has elapsed before the synchronized ready signal output enters to ON-state.

10. The apparatus of claim 7 , wherein
    the wait state counter output and the output of the synchronizer are connected to an OR-gate configured to provide the ON-state data ready signal.

\* \* \* \* \*